United States Patent [19]

Germer

[11] Patent Number: 4,594,545

[45] Date of Patent: Jun. 10, 1986

[54] OPERATION OF ELECTRONIC DEMAND REGISTER FOLLOWING A POWER OUTAGE

[75] Inventor: Warren R. Germer, Dover, N.H.

[73] Assignee: General Electric Company, Somersworth, N.H.

[21] Appl. No.: 599,743

[22] Filed: Apr. 12, 1984

[51] Int. Cl.$^4$ ............................................. G01R 11/64
[52] U.S. Cl. ................................. 324/103 R; 364/483
[58] Field of Search ........................... 324/103 R, 116; 364/483

[56] References Cited

U.S. PATENT DOCUMENTS

| | | | |
|---|---|---|---|
| 3,586,974 | 6/1971 | Ham | 324/103 R |
| 4,179,654 | 12/1979 | Germer | 324/103 R X |
| 4,197,582 | 4/1980 | Johnston et al. | 364/483 |
| 4,229,795 | 10/1980 | Vieweg et al. | 364/483 |
| 4,283,772 | 8/1981 | Johnston | 324/103 X |
| 4,301,508 | 11/1981 | Anderson et al. | 364/483 |
| 4,361,872 | 11/1982 | Spalti | 324/76 R X |
| 4,368,519 | 1/1983 | Kennedy | 377/19 |
| 4,465,970 | 8/1984 | DiMassimo et al. | 324/103 R X |
| 4,467,434 | 8/1984 | Hurley et al. | 324/103 R X |

FOREIGN PATENT DOCUMENTS 2633182  1/1978  Fed. Rep. of Germany ... 324/103 R

Primary Examiner—Stewart J. Levy
Assistant Examiner—Stephen M. Baker
Attorney, Agent, or Firm—Robert E. Brunson; Thomas R. Morrison

[57] ABSTRACT

An electronic demand register performs rolling demand metering in which a demand interval is divided into N subintervals. At the end of each subinterval, the demand data from the just-completed subinterval is summed with the demand in the most-recent N−1 contiguous subintervals to derive an interval demand. In the event of a power outage, the existing value of maximum demand, and a number representing the time remaining in the subinterval interrupted by the power outage, as well as programmed constants, are stored in non-volatile memory for safekeeping during the power outage. After power is restored, the stored values are used to preset a maximum demand storage to the saved value of maximum demand and to preset a subinterval timing down counter to the value it had upon the detection of an impending power outage. A logic circuit freezes accumulation of demand data for a grace period following power restoration to avoid detection of an artificially high demand from synchronized starting loads. When the accumulation of demand data is resumed, a first partial subinterval, equal to the remainder of the interrupted subinterval, is employed for collecting demand data with the demand for the prior N−1 subintervals set to zero before beginning the collection of demand data in full subintervals. This avoids the synchronization of demand periods in other demand registers in the area affected by the power outage.

7 Claims, 3 Drawing Figures

OPERATION OF ELECTRONIC DEMAND REGISTER FOLLOWING A POWER OUTAGE

BACKGROUND OF THE INVENTION

The present invention relates to electric meters and, more particularly, to apparatus and method for controlling electronic demand registers of electric meters following a power outage.

Conventional electric meters employ an aluminum disk driven as a rotor of a small induction motor by an electric field at a speed which is proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

In addition to the above measurement of consumption, some electric meters contain demand registers having means for separating the consumption into those parts of consumption occurring during peak and off-peak hours (however defined) and for recording maximum demand during a predetermined period of time in order to adjust billing according to such parameters. In one such meter disclosed in U.S. Pat. No. 3,586,974, a mechanical demand register records the power usage during a predetermined period of time and stores the value for reading. The predetermined period of time may be, for example, the time between meter readings, or a period of time corresponding to the billing period of the utility providing the power. A clockwork mechanism restarts the demand register at regular intervals of, for example, a fraction of an hour, so that, at the end of the predetermined period, the stored value represents the highest value of power usage occurring during any one of the regular intervals in the predetermined period.

Demand registers of the mechanical type, such as disclosed in the above U.S. patent, have limited flexibility. Once their design is completed for a particular meter physical configuration, the design is not transferrable to a meter having a different physical configuration. Also, the demand-measurement functions cannot be redefined without major mechanical redesign.

When a power outage occurs, the motor driving the demand register is halted. Following the restoration of power, the motor driving the demand register is restarted without recognizing the fact that a power outage has occurred. There is some question whether resumption of operation can be performed in this way while strictly abiding by the regulations for demand metering as defined by the commissions having jurisdiction over the utility providing the electric power and without penalizing a customer for an apparent very high demand which is the result of the power outage and resumption and not the fault of the customer.

Maximum demand metering is conventionally defined as the maximum amount of power consumed in any one contiguous time period during the time interval of interest; that is, the maximum amount of power consumed in any one of the periods of, for example, 15 minutes, 30 minutes or one hour. If the accumulation of actual usage during one of such time periods is paused by a power outage and then resumed, the demand accumulated at the end of the interrupted time period consists of an initial portion before the outage interruption and a final portion following the outage interruption. Not only does the intervention of the outage interruption appear to violate the definition of demand metering, but also, if the customer load includes a substantial number of motors or other devices having a large starting load compared to their running load, when power is restored, all or most of such motors and devices may be forced to go through their starting sequence at the same time. Under normal conditions, some of the customer's motors may run continuously and others may cycle on and off in an unsynchronized manner. Thus, the motor starting loads are normally distributed over time and their effect on demand metering is similarly distributed over time. As is well known, the starting load imposed by a motor is much higher than the running load. By synchronizing all or most of the customer's starting load in a single time period following restoration of power, an unnaturally high demand may be registered in that time period when, in fact, the unnaturally high demand is the result of the utility permitting a power outage to occur and not the result of the customer load producing the registered maximum demand.

In addition to the above limitations of mechanical demand metering, a useful demand metering technique known as rolling demand is not practically feasible using mechanical demand registers. In rolling demand metering, a demand interval is divided into N contiguous subintervals. The usage during each demand subinterval is summed with the demand recorded during the preceding $N-1$ subintervals. At the end of each subinterval, the total demand recorded is the demand for N subintervals, i.e. for the entire preceding demand interval. The maximum demand may then be taken as the maximum over any interval sensed at the end of a subinterval. The use of such rolling demand metering avoids distortion in the billing data which could otherwise occur due to short-term extremes in the usage data which would otherwise become lost in the averaging process over an entire demand interval.

Greater flexibility in demand metering may be obtainable using electronic acquisition, integration and processing of power usage. An electronic processor such as, for example, a microprocessor, may be employed to manage the acquisition, storage, processing and display of the usage and demand data. U.S. Pat. Nos. 4,179,654; 4,197,582; 4,229,795; 4.283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the demand during defined periods of time.

An electronic processor of an electronic demand register conventionally employs volatile random access memory for the high speed and low power consumption characteristics offered by such devices. When a power outage occurs, if steps are not taken to prevent it, all data in such volatile storage may be lost. This could include both prior demand data as well as a sense of where in a time period the outage occurred. The loss of demand data has an obvious negative impact on billing. The loss of time sense would require that all users in the area affected by the power outage must begin a new time period for accumulation of demand. Such synchronization of demand metering is considered undesirable by at least some utilities. U.S. patent application Ser.

No. 599,736, filed on the same date as the present application, the disclosure of which is herein incorporated by reference, discloses means for storing data in non-volatile memory when a power outage occurs and for ignoring or tolerating certain normal deviations of the line power, such as, for example, momentary overvoltage, surges, noise and momentary power outages enduring for a very short time period. This new capability to store demand billing data and programmed constants in non-volatile memory permits re-thinking the manner in which demand data accumulated before and after an outage interruption may be handled so as to provide fairness both to the consumer and to the utility.

OBJECTS AND SUMMARY OF THE INVENTION

Accordingly, it is an object of the invention to provide an electronic demand register having apparatus and method for controlling the resumption of demand metering which overcomes the drawbacks of the prior art.

It is a further object of the invention to provide an electronic demand register of the type employing a digital processor and a random access memory which includes means for storing volatile data in a non-volatile storage medium during a power outage and for retrieving the data from the non-volatile storage medium and resuming normal operation following the power outage in a manner which retains relevant billing data accumulated before the power outage, avoids synchronization of demand time periods of all customers affected by the power outage and provides the customer a predetermined grace period after the resumption of power before beginning the accumulation of demand data to avoid penalizing the customer for artificially high demand resulting from motor startup after the outage and not the result of the customer's actual demand for power.

Briefly stated, the present invention provides an electronic demand register for performing rolling demand metering in which a demand interval is divided into N subintervals. At the end of each subinterval, the demand data from the just-completed subinterval is summed with the demand in the most-recent $N-1$ contiguous subintervals to derive an interval demand. In the event of a power outage, the existing value of maximum demand, and a number representing the remainder of time in the subinterval interrupted by the power outage, as well as programmed constants, are stored in non-volatile memory for safekeeping during the power outage. After power is restored, the stored values are used to preset a maximum demand storage to the saved value of maximum demand and to preset a subinterval timing down counter to the value it had upon the detection of an impending power outage. A logic circuit freezes accumulation of demand data for a grace period following power restoration to avoid detection of an artificially high demand from synchronized starting loads. When the accumulation of demand data is resumed, a first partial subinterval, equal to the remainder of the interrupted subinterval, is employed for collecting demand data starting at zero with the demand for the prior $N-1$ subintervals set to zero before beginning the collection of demand data in full subintervals. This avoids the synchronization of demand periods in other demand registers in the area affected by the power outage.

According to an embodiment of the invention there is provided apparatus for controlling demand metering in an electronic demand register of the type including non-volatile memory and a digital processor including a volatile memory, the electronic demand register being effective to accumulate a demand in each of successive time periods and to store a maximum demand of the demands occurring in one of the successive time periods, comprising means responsive to an impending power outage for storing at least the maximum demand and a remainder of a time period which is interrupted by the impending power outage, means responsive to a resumption of power for returning the maximum demand and the remainder of a time period to the volatile memory and means for accumulating a demand starting at zero demand for an initial time period substantially equal to the remainder of a time period before resuming accumulation of a demand in full successive time periods.

According to a feature of the invention there is provided a method for controlling demand metering in an electronic demand register of the type including non-volatile memory and a digital processor including a volatile memory, the electronic demand register being effective to accumulate a demand in each of successive time periods and to store a maximum demand of the demands occurring in one of the successive time periods, comprising storing at least the maximum demand and a remainder of a time period which is interrupted by an impending power outage, returning the maximum demand and the remainder of a time period to the volatile memory upon resumption of power and accumulating a demand, starting at zero demand for an initial time period substantially equal to the remainder of a time period before resuming accumulation of a demand in full successive time periods.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Although the present invention may be adapted to any suitable style of electric meter which employs an element rotating at a speed proportional to power consumption, including, for example, single phase or polyphase meters with one or more current and voltage coils, for concreteness, the detailed description which follows is directed toward an illustrative example of a 2-wire single phase meter of the type having a single current coil and a single voltage coil.

Figure 1:
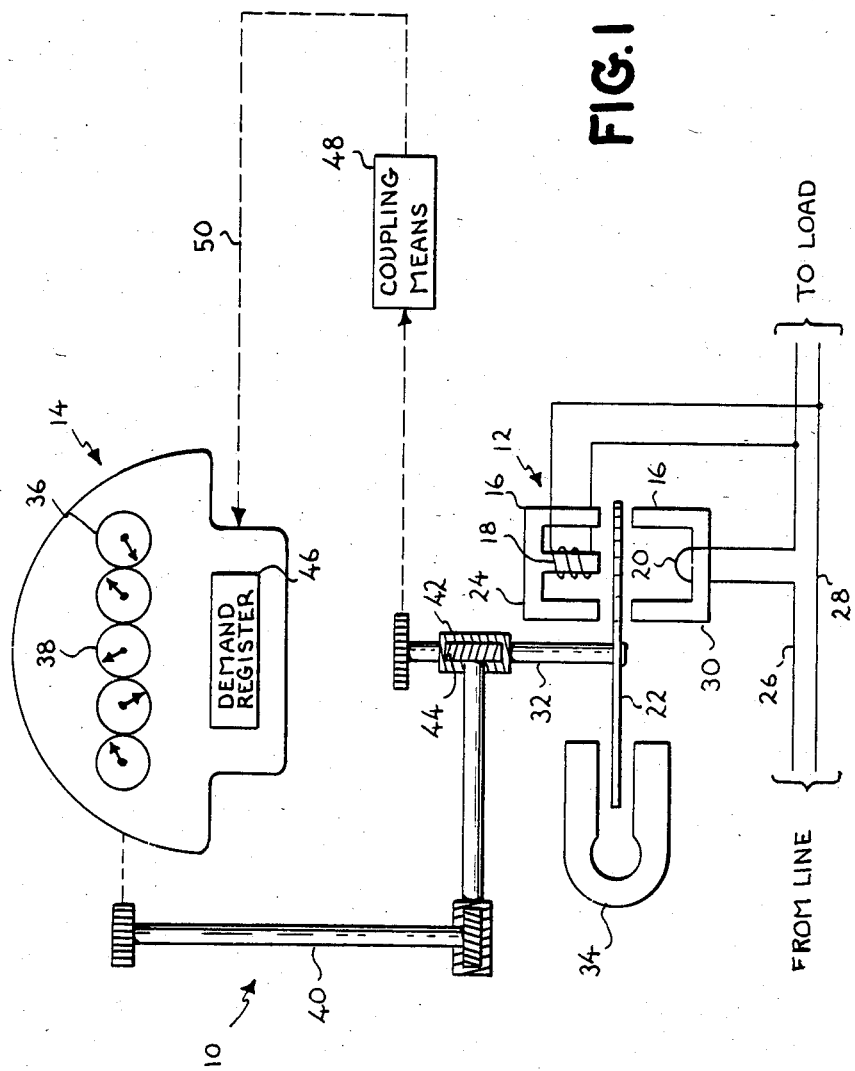
FIG. 1 is a schematic diagram of an electric meter to which the present invention may be applied.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 30 upon which a small number of turns, typically two or more, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20, combined with the retarding torque produced by permanent magnet 34, is effective to rotate disk 22 at a speed which is proportional to the product of the voltage and the current; that is, the power, consumed by the load.

Register 14 includes a watthour register 36 which may include, for example, a plurality of dials 38 which are suitably geared and driven by a suitable mechanical coupling 40 in proportion to the rotation of shaft 32. In the embodiment shown, mechanical coupling 40 includes a worm 42, which may be integrally formed in shaft 32, engaging and rotating a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46, shown schematically as a box in FIG. 1, is also connected by a suitable coupling means 48 to respond to the rotation of shaft 32. In the prior art, demand register 46 is conventionally a mechanical register having dials, or other indicating devices (not shown), and coupling means 48 is conventionally a mechanical arrangement including shafts and gearing driven by rotation of shaft 32. The dials, or indicating devices, in the mechanical embodiment of demand register 46 are urged forward for a fixed period of time by a pusher mechanism (not shown). The pusher mechanism is reset and restarted at the end of each of the fixed periods of time, leaving the indicating devices with an indication proportional to the power usage (the demand) during the fixed period of time. The indication on the indicating devices at any time is, therefore, the highest demand which has occurred during any one of the time periods since the last time the indicating devices were reset. The recorded demand is employed in billing.

When a power outage occurs, the timing motor driving the gearing of mechanical demand register 46 is halted at whatever stage in the time period and at whatever demand readings existed on demand register 46 at the time the power outage occurred. At the end of the power outage, the motor again begins driving the gear train and dials from the positions they had at the beginning of the power outage and demand metering is resumed from the same position within the demand metering interval as existed at the beginning of the power outage. As previously noted, this practice may fail to rigorously satisfy the definition of demand metering and may also impose an unfair burden on the user. This system does have the one desirable feature, however, that since the demand metering picks up at the same point in the demand interval that it had when the outage occurred, it proceeds to complete the demand interval and thus a power outage does not have the effect of synchronizing all of the demand registers in the affected area.

In the present invention, demand register 46 is an electronic demand register.

Figure 2:
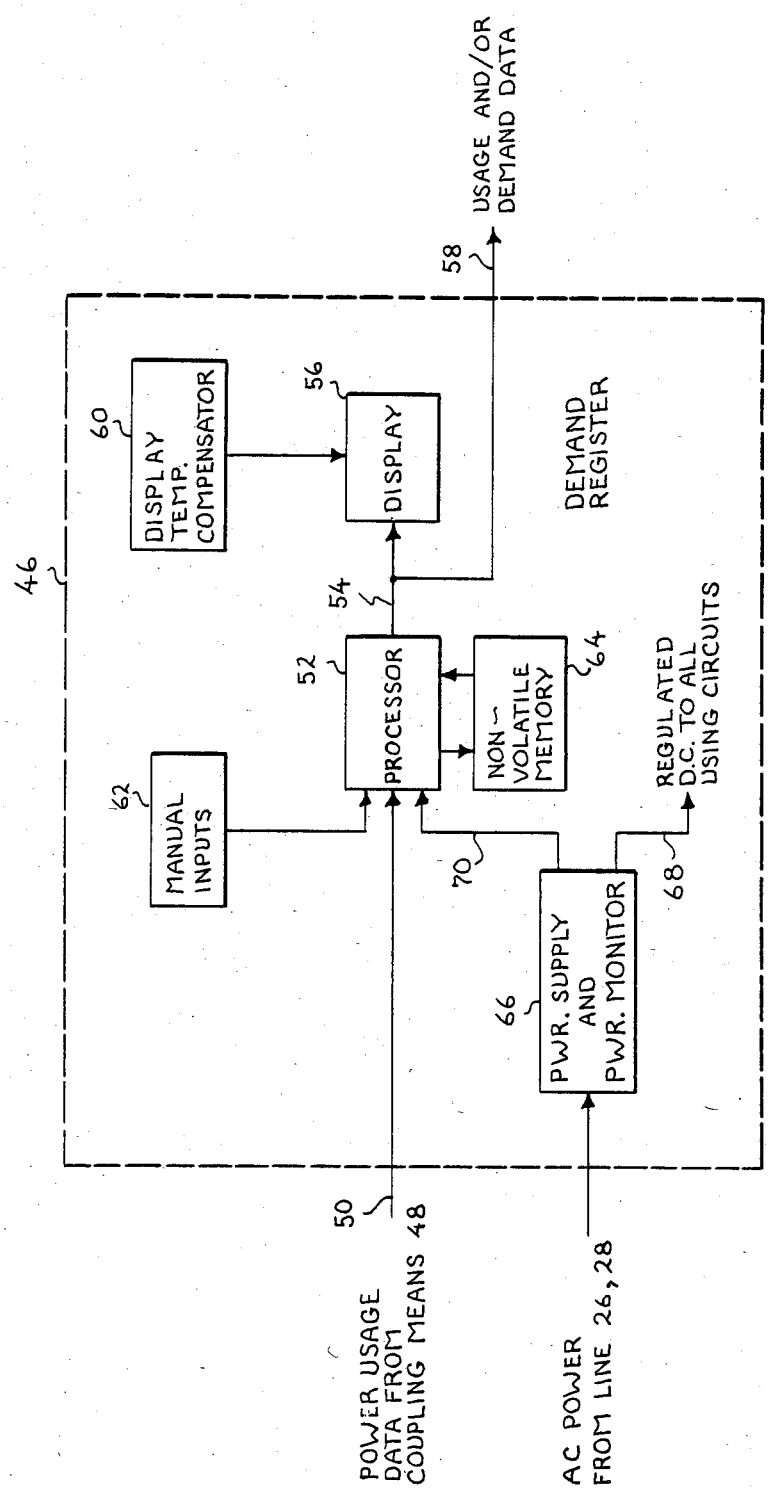
FIG. 2 is a block diagram of a demand register of FIG. 1 according to an embodiment of the invention.

Referring to FIG. 2, there is shown a simplified block diagram of a demand register 46 according to an embodiment of the invention. For present purposes, it is sufficient to note that the signal related to power usage fed from coupling means 48 to demand register 46 is an electronic signal having a characteristic such as, for example, a frequency or pulse repetition rate, which is variable in dependence on the rate of power usage. Any suitable electronic signal generating apparatus, such as, for example, an apparatus such as one of those disclosed in the referenced prior patents, may be employed to produce a power usage signal which is applied on a line 50 to a processor 52 in demand register 46. Processor 52 appropriately performs calculations on the usage data, such as, for example, counting pulses and scaling, to derive desired demand parameters and stores the result. In addition, processor 52 may provide an output on a line 54 suitable for driving a display 56. The stored data may be transmitted on a line 58 to a remote location (not shown) for further analysis and/or billing.

Due to the extremes of environment in which electric meters may be used, display 56 may need special compensation for environmental parameters. Such special compensation may include a display temperature compensator 60 whose detailed structure and function are not of interest to the present disclosure.

The data which processor 52 transmits for display and/or the manner in which processor 52 operates on the input data to produce internally stored values may be modified according to a manual input 62 for changing the operating mode of demand register 46 or the data displayed on display 56 as will be further detailed hereinafter.

As previously noted, processor 52 conventionally employs volatile random access memory elements which lose any data stored in them in the event of a power outage. This is usually not acceptable in an electric meter where such loss of usage and/or demand data has a negative financial impact on the utility supplying the electric power. Non-volatile storage elements such as, for example, electrically erasable programmable read only memory elements, are well known for use with processor 52. However, such non-volatile storage elements normally have relatively slow memory erase and write times on the order of 10 or 20 milliseconds. This is too slow for most applications. Besides this drawback, the power required to write such memory elements is quite high compared to that required by volatile memory elements of processor 52. Finally, a wear-out mechanism in electrically erasable programmable read only memory cells limits the number of times they can be erased and re-recorded. About 10,000 cycles of write and erase brings such a memory element to the end of its reliable useful life. The volatile memory elements in processor 52 must, of course, be written and erased many thousands of times a day. Thus, an electrically erasable programmable read only memory would have a very short life as the operating memory for processor 52.

In order to provide safe storage for data and/or programmed constants during a power outage or during test operation, a conventional non-volatile memory 64 is provided into which such data and constants can be written and from which the data and constants can again be read upon restoration of normal conditions. In their role in non-volatile memory 64, electrically erasable programmable read only memory elements are erased and rewritten only when a relatively serious power outage occurs and possibly during a relatively small number of test cycles. Such operations are not expected to occur on a frequent enough basis in demand register 46 of electric meter 10 to represent a limit on the life of the register.

A power supply and power monitor 66 receives AC power from lines 26 and 28 for the production of a regulated DC voltage which is applied on a line 68 to all circuits in demand register 46 requiring such power. In addition to producing regulated DC power, power supply and power monitor 66 also monitors the condition of the AC power on lines 26 and 28 and, in response to detected conditions indicating the possibility an impending power outage or the actuality of such a power outage, applies an emergency store signal on a line 70 to processor 52 which controls the transfer of data from processor 52 to non-volatile memory 64 in the event of an apparent power outage and resets processor 52 in the event of an actual power outage. Prior to transferring the data and programmed constants to non-volatile memory 64, processor 52 checks to determine whether the demand during the current interval up to the time of the power outage exceeds the maximum demand previously recorded. If the demand in the current interval does exceed the maximum demand, the demand for the current interval is substituted for the maximum demand and the thus-modified data is transmitted to non-volatile memory 64 for storage. Upon restoration of power, power supply and power monitor 66 applies a reset signal on line 70 to processor 52 for initiating the sequence for resuming demand metering, as will be explained. A full disclosure of the structure and function of power supply and power monitor 66 is contained in U.S. patent application Ser. No. 599,736 which is herein incorporated by reference.

Figure 3:
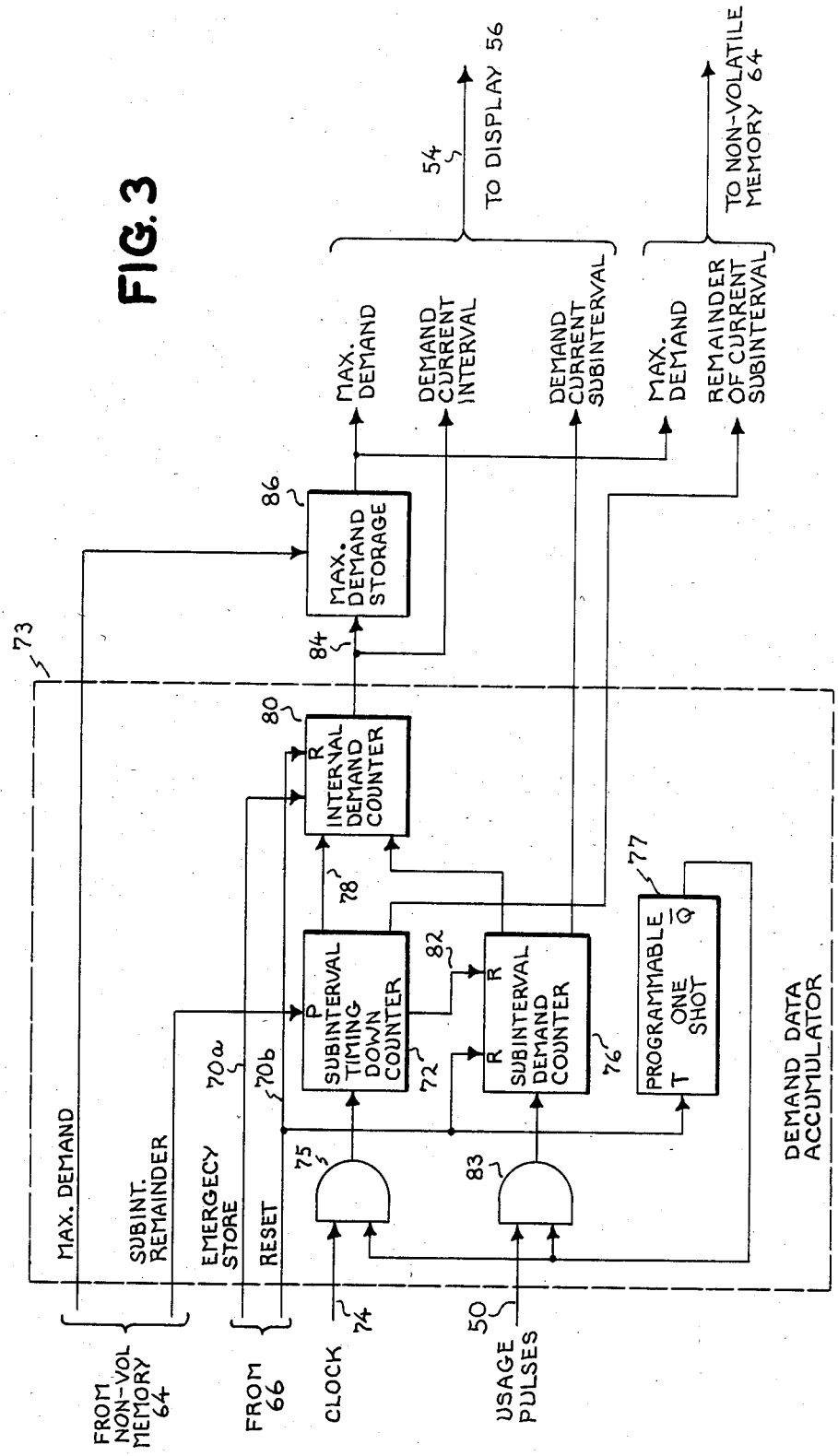
FIG. 3 is a functional block diagram of a demand data accumulator and maximum demand storage suitable for use in the electronic demand register of FIG. 2.

Referring now to FIG. 3, in normal operation, a subinterval timing down counter 72 in a demand data accumulator 73 is preset to a predetermined value at the beginning of each subinterval. A clock signal having a predetermined frequency is fed from a line 74, through an AND gate 75 to an input of subinterval timing down counter 72. An enable signal is normally maintained at the second input of AND gate 75 by the inverting output of a programmable one shot 77. The clock signal counts down the number in subinterval timing down counter 72 from the predetermined value to zero. Due to the ready availability of a stable power line frequency of 50 or 60 Hertz in meter service, the predetermined frequency of the clock signal is preferably either the power line frequency itself on line 74 or a frequency which may be derived from the power line frequency by, for example, counting down or phase locking. A count in a subinterval demand counter 76 is zeroed at the beginning of each subinterval by a reset signal fed on a line 82 to a reset input R. While subinterval timing down counter 72 counts down, the cycles of the power usage signal on line 50 are fed through an AND gate 83 to subinterval demand counter 76. The second input of AND gate 83 is normally enabled by the inverting output of programmable one shot 77.

As the count in subinterval timing down counter 72 reaches zero, an enable signal on a line 78 enables the storage of the accumulated subinterval demand from subinterval demand counter 76 in an interval demand counter 80. After the accumulated subinterval demand from subinterval demand counter 76 is stored in interval demand counter 80, the reset signal is applied on line 82 from subinterval timing down counter 72 to the reset input R of subinterval demand counter 76. The reset signal again resets the number, or count, in subinterval demand counter 76 to a predetermined value such as, for example, zero. At the same time, subinterval timing down counter 72 is again preset to the predetermined value from which it is counted down to zero over the next subinterval by the predetermined frequency.

Interval demand counter 80 adds the demand value of the current subinterval to the sum of the demand values of the preceding $N-1$ subintervals to derive a value for the interval demand in the entire N preceding subintervals making up an interval. The interval demand from the immediately preceding interval is applied on a line 84 to a maximum demand storage 86. If the newly received interval demand exceeds the maximum interval demand previously stored in maximum demand storage 86 since the last reset, maximum demand storage 86 discards the previous maximum value and stores the newly received interval demand as the new maximum demand against which the demand from succeeding intervals are compared. Interval demand counter 80 thereupon discards the subinterval demand from the oldest of the N subintervals so that the remaining stored value in interval demand counter 80 again represents the demand from the $N-1$ most recent subintervals.

At least some of the data stored in the apparatus of FIG. 3 may be transmitted on line 54 to display 56.

When an impending power outage is detected by power supply and power monitor 66, the end-of-subinterval procedure described in the preceding is initiated by an emergency store signal from power supply and power monitor 66 on line 70a which is applied to interval demand counter 80 to determine whether the interval demand calculated from the demand in the $N-1$ preceding subintervals, plus the demand accumulated in subinterval demand counter 76 during the portion of the subinterval up to the time of the detection of an impending power outage, exceeds the maximum demand stored in maximum demand storage 86. If the new value of interval demand calculated in this way exceeds the previously stored maximum demand, the old value of maximum demand in maximum demand storage 86 is replaced by a new value of maximum demand from interval demand counter 80. On completion of this operation, the maximum demand value from maximum demand storage 86 and a value representing the remainder of the interrupted subinterval from subinterval timing down counter 72 are transmitted to non-volatile memory 64 for storage during an ensuing power outage.

When power is restored, power supply and power monitor 66 produces a reset signal which enables feeding the stored number representing the remainder of the interrupted subinterval to a preset input P of subinterval timing down counter 72 and the value of stored maximum demand to maximum demand storage 86. At about the same time, a reset signal is applied on a line 70b from power supply and power monitor 66 to reset inputs of interval demand counter 80 and subinterval demand counter 76 which is effective to reset these elements to zero. In addition, the reset signal is applied to a trigger input T of programmable one shot 77. The reset signal at its trigger input T triggers programmable one shot 77 into beginning its timing cycle which endures for a predetermined period of time. During the timing cycle of programmable one shot 77, the inverting output of programmable one shot 77 applies an inhibit signal to inputs of AND gate 75 and AND gate 83. The inhibit signal at their inputs prevents the inputs of AND gate 75 and AND gate 83 from being applied to their outputs. Thus, for the duration of the timing cycle of programmable one shot 77, the number stored in subinterval timing down counter 72 remains at the value preset therein representing the remainder of the interrrupted subinterval, and the value in subinterval demand counter 76 remains at zero.

At the completion of the predetermined period of time, programmable one shot 77 times out and again applies an enable signal at the inputs of AND gates 75 and 83. AND gates 75 and 83 are thereby enabled to apply the clock and usage pulses respectively to subinterval timing down counter 72 and subinterval demand counter 76. In this way, accumulation of demand is resumed only at the end of the predetermined time period after the restoration of power. The length of the predetermined time period may be chosen to provide a grace period without demand metering for long enough to permit stabilization of the consumer's load, including, for example, the startup load for the consumer's motors and other loads which may produce an abnormal demand in the period following resumption of power after an outage. By storing and using the remaining of the interrupted subinterval upon resumption of power, synchronization of all demand metering within the area affected by the power outage is avoided. That is, all demand meters in the affected area resume operation with about the same mutual offsets as existed before the power outage. Thus, one of the advantages of mechanical demand metering is retained.

Once programmable one shot 77 times out, subinterval timing down counter 72 begins counting down for a period determined by the number restored in it and the usage pulses on line 50 are accumulated in subinterval demand counter 76, starting at zero. When subinterval timing down counter 72 is counted down to zero, the demand value then contained in subinterval demand counter 76 is transferred to interval demand counter 80 where it is added to the demand value for the preceding N−1 subintervals (all of which are zero at this time). This value for the sum of the N−1 blank subintervals, plus the demand in the remainder of the interrupted subinterval, is applied to maximum demand storage 86 for comparison with the stored maximum demand as previously described. Following the comparison, the demand for the oldest subinterval stored in interval demand counter 80 (which is zero at this time) is deleted in preparation for the summing operation at the end of the ensuing subinterval. It is only after a full N subintervals have elapsed after the end of the interrupted subinterval that full demand metering based on actual demand during a set of N contiguous full subintervals is performed. From that point, normal subinterval demand accumulation, addition of the just-completed subinterval demand with the prior N−1 subinterval demands and comparison of the result with the maximum stored demand is carried out as previously described.

The demand metering and resumption following a power outage may be performed with any suitable apparatus including, for example, discrete components, digital, analog or digital/analog hybrid circuits. In a digital implementation of the present invention, use may be made of a main-frame computer, a minicomputer or a microprocessor. In the preferred embodiment of the invention, processor 52 is a microprocessor and may be, for example, of the type sold commercially by NEC under the designation upD7503. Although they are illustrated as separate logic functions, appropriate ones, or all, of the functions illustrated in FIG. 3 may preferably be performed by the microprocessor without departing from the spirit and scope of the invention. In a microprocessor implementation of the invention, programmable one shot 77 may be a simulated down counter in which a number representing the predetermined timing interval may be preset and the down counter may be counted down to zero using a clock signal such as, for example, a clock signal derived from the AC line frequency. In the most preferred embodiment of the invention, the number to be preset into programmable one shot 77 is included in the set of programmed constants which are saved in non-volatile memory 64 during a power outage. This permits programming the length of the delay before the resumption of demand metering by changing the programmed constant controlling the timing cycle of the down counter.

In the manner described hereinabove, rolling demand metering with an electronic processor accommodates the occurrence of a power outage while adhering strictly to the conventional definition of demand metering without losing previously stored maximum demand data or unfairly penalizing the energy consumer for artificially high demand resulting from startup loads. In addition, resumption of normal operation is provided for after a grace period in a manner which permits demand accumulation to begin from zero in the point in a subinterval corresponding to the point at which the subinterval was interrupted by a power outage.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for controlling demand metering in an electronic demand register of the type including non-volatile memory and a digital processor including a volatile memory, said electronic demand register being effective to accumulate a demand in each of successive time periods and to store a maximum demand of the demands occurring in one of the successive time periods, comprising:

means responsive to an impending power outage for storing at least said maximum demand and a remainder of a time period which is interrupted by said impending power outage;

means responsive to a resumption of power for returning said maximum demand and said remainder of a time period to said volatile memory; and means for accumulating a demand, starting at zero demand, for an initial time period substantially equal to said remainder of a time period before resuming accumulation of a demand in full successive time periods.

2. Apparatus according to claim 1, further comprising means for pausing a beginning of said initial time period for a predetermined grace period following said resumption of power.

3. Apparatus according to claim 2 wherein said means for accumulating a demand includes a demand counter and a timing counter, said timing counter including means for permitting the presetting thereof to a first timing value representing said remainder of a time period and for responding to a clock signal for one of incrementing and decrementing said first timing value until a second timing value is reached, said demand counter including means for accumulating power usage data until said second timing value is reached, said power usage data accumulated when said second timing value is reached being a demand for said remainder of a time period, and means responsive to said second timing value being reached for presetting a third timing value in said timing counter, said third timing value representing a full time period.

4. Apparatus according to claim 3 wherein said means for pausing a beginning of said initial time period includes logic means for preventing said clock signal from changing said first timing value and for preventing said demand counter from accumulating said power usage data until an end of said predetermined grace period.

5. Apparatus for controlling demand metering in an electronic demand register of the type including non-volatile memory and a digital processor including a volatile memory, said electronic demand register being effective to accumulate a demand in each of successive time periods and to store a maximum demand of the demands occurring in one of the successive time periods, comprising:
means responsive to an impending power outage for storing at least said maximum demand and a remainder of a time period which is interrupted by said impending power outage;
means responsive to a resumption of power for returning said maximum demand and said remainder of a time period to said volatile memory;
means for accumulating a demand, starting at zero demand for an initial time period substantially equal to said remainder of a time period before resuming accumulation of a demand in full successive time periods; and
means for pausing a beginning of said initial time period for a predetermined grace period following said resumption of power.

6. A method for controlling demand metering in an electronic demand register of the type including non-volatile memory and a digital processor including a volatile memory, said electronic demand register being effective to accumulate a demand in each of successive time periods and to store a maximum demand of the demands occurring in one of the successive time periods, comprising:
storing at least said maximum demand and a remainder of a time period which is interrupted by an impending power outage;
returning said maximum demand and said remainder of a time period to said volatile memory upon resumption of power; and
accumulating a demand, starting at zero demand, for an initial time period substantially equal to said remainder of a time period before resuming accumulation of a demand in full successive time periods.

7. A method for controlling demand metering in an electronic demand register of the type including non-volatile memory and a digital processor including a volatile memory, said electronic demand register being effective to accumulate a demand in each of successive time periods and to store a maximum demand of the demands occurring in one of the successive time periods, comprising:
storing at least said maximum demand and a remainder of a time period which is interrupted by an impending power outage;
returning said maximum demand and said remainder of a time period to said volatile memory upon resumption of power;
accumulating a demand, starting at zero demand, for an initial time period substantially equal to said remainder of a time period before resuming accumulation of a demand in full successive time periods; and
pausing a beginning of said initial time period for a predetermined grace period following said resumption of power.

* * * * *